US007227351B2

(12) United States Patent
Kim et al.

(10) Patent No.: US 7,227,351 B2
(45) Date of Patent: Jun. 5, 2007

(54) APPARATUS AND METHOD FOR PERFORMING PARALLEL TEST ON INTEGRATED CIRCUIT DEVICES

(75) Inventors: Woo-Il Kim, Chungcheongnam-do (KR); Hyun-Seop Shim, Incheon-si (KR); Hyoung-Young Lee, Gyeonggi-do (KR); Young-Ki Kwak, Chungcheongnam-do (KR); Jeong-Ho Bang, Gyeonggi-do (KR); Ki-Bong Ju, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/856,461

(22) Filed: May 27, 2004

(65) Prior Publication Data

US 2005/0007140 A1    Jan. 13, 2005

(30) Foreign Application Priority Data

Jul. 11, 2003    (KR) .............. 10-2003-0047415

(51) Int. Cl.
*G01R 31/28* (2006.01)
(52) U.S. Cl. .................. 324/158.1; 324/765; 324/73.1
(58) Field of Classification Search ............... 324/765, 324/754, 72.5, 73.1, 158.1; 714/719, 724; 438/14, 17, 18; 365/201; 257/48
See application file for complete search history.

(56) References Cited

U.S. PATENT DOCUMENTS 5,375,075 A * 12/1994 Ogata et al. .............. 702/119
5,444,390 A * 8/1995 Bartlett et al. ............. 324/770
5,500,588 A * 3/1996 Worley .................... 324/158.1
5,661,626 A * 8/1997 Takeuchi ................... 361/93.2
5,844,913 A    12/1998 Hassoun et al.
6,198,302 B1    3/2001 Dougherty
6,326,639 B1 * 12/2001 Schneider et al. ............ 257/17
6,480,978 B1    11/2002 Roy et al.
6,657,455 B2 * 12/2003 Eldridge et al. ........... 324/765
6,731,125 B2 *  5/2004 Chang ...................... 324/765

FOREIGN PATENT DOCUMENTS

JP        2001-176293        6/2001

OTHER PUBLICATIONS

English language abstract of Japanese Publication No. 2001-176293.

\* cited by examiner

*Primary Examiner*—Paresh Patel
(74) *Attorney, Agent, or Firm*—Marger Johnson & McCollom, P.C.

(57) ABSTRACT

Embodiments of the invention connect a plurality of devices under test (DUTS) in a parallel manner and a high test current is selectively applied to each DUT. The apparatus to test a plurality of DUTs includes a plurality of power sources providing the test current to a plurality of DUTs; and switching devices connected to the respective DUTs and power sources and selectively providing the test current. In addition, the apparatus has at least one control unit to control the switching devices. Furthermore, a group of DUTs from the plurality of DUTs is connected between two of the plurality of power sources in a parallel manner, and the test current is selectively provided to one DUT from the group of DUTs according to the operation of the switching devices.

20 Claims, 4 Drawing Sheets

APPARATUS AND METHOD FOR PERFORMING PARALLEL TEST ON INTEGRATED CIRCUIT DEVICES

CROSS REFERENCE TO RELATED APPLICATIONS

This application claims priority from Korean Patent Application No. 2003-47415, filed on Jul. 11, 2003, in the Korean Intellectual Property Office, the disclosure of which is incorporated by reference in its entirety for all purposes.

BACKGROUND OF THE INVENTION

1. Field of the Invention

This disclosure relates to a test apparatus of an integrated circuit, and more particularly, to a parallel test apparatus and method of the integrated circuit capable of injecting a high test current.

2. Description of the Related Art

Generally, an integrated circuit device (hereinafter IC) is manufactured through multiple processes. Afterwards, a test process is performed to check whether the IC works properly and has any defects in its parts.

There are two types of test apparatus that can be used to perform the test process. One type is a single test apparatus that tests a single device under test (DUT) at one time and another type is a parallel test apparatus that tests several DUTs at the same time. The parallel test apparatus, which is very useful in mass production, is disclosed in U.S. patent application Ser. No. 6,480,978, entitled "Parallel Testing of Integrated Circuit Devices Using Cross-DUT and Within-DUT Comparisons" and Japanese Patent Publication No. 2001-176293, entitled "Test Method For Semiconductor Memory, And Test Device".

FIG. 1 is a block diagram schematically illustrating a general apparatus to perform a parallel test on a plurality of devices under test (DUTs).

As illustrated in FIG. 1, four DUTs (DUT1~DUT4) are connected to a test circuit unit 10. The DUT1 through DUT4 may each have two power pins (VDD, VDDQ), and the test circuit unit 10 may include a power supply providing a test current to the DUT1 through the DUT4, a memory set (not shown) storing a test data, and a compare unit (not shown) comparing data stored in the memory set and test devices from the DUT1 through the DUT4 and outputting whether the data is normal or abnormal.

The test circuit unit 10 includes a first through a third power source VS1, VS2, and VS3. The VDDs of DUT1 and DUT2 are connected to the first power source VS1, the VDDs of DUT3 and DUT 4 are connected to the second power source VS2, and the VDDQs of DUT1 through DUT4 are connected to the third power source VS3. Thus, DUT1 through DUT4 are connected to the test circuit 10 in a parallel manner.

In a parallel test apparatus having the above structure, if a predetermined voltage V is applied from the first through the third power source VS1, VS2, and VS3 in the test circuit unit 10, a test-performing current flows to the respective test devices of the DUT1 through the DUT4.

The VDDs of DUT1 and DUT2 are commonly connected to the first power source VS1, and thus the current of the first power source VS1 is distributed to each VDD of DUT1 and DUT2. For instance, if an 800 mA current is generated in the first power source VS1, a 400 mA current flows into each VDD of DUT1 and DUT2. This applies to the VDDs of DUT3 and DUT4, each having half of the current generated in the second power source VS2.

However, in a case where a high integrated memory device such as a double data rate RAM (DDR), a test current of 400 mA or more per unit test device is required. Thus, if a set of DUTs shares one power source, the test current provided is divided to each DUT. The amount of the test current divided depends on the number of DUTs. Therefore, it is difficult to provide the high test current to each DUT. In this case, test efficiency and product reliability is decreased because the test may be improperly performed in the devices requiring the high test current. In addition, production cost is increased since a new instrument including the strong power supply should be added to obtain the high test current.

Embodiments of the invention address these and other disadvantages of the conventional art.

SUMMARY OF THE INVENTION

Some embodiments of the invention provide a test apparatus to test a plurality of devices under test (DUTs), the parallel test apparatus includes a plurality of power sources providing a test current to a plurality of DUTs, switching devices connected to the respective DUTs and power sources for selectively providing the test current, and at least one control unit to control an operation of the switching device. In the test apparatus, a set of DUTs from the plurality of DUTs is connected to one power source in a parallel manner, and the test current is provided only to one DUT out of the plurality of DUTs connected in a parallel manner according to the operation of the switching device.

The control unit outputs a first signal that turns each of the switching devices on and a second signal that selectively turns one of the switching devices connected to the respective power sources on at the same time. The DUTs include first and second power pins and the switching device is installed between the first power pin and the corresponding power source.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
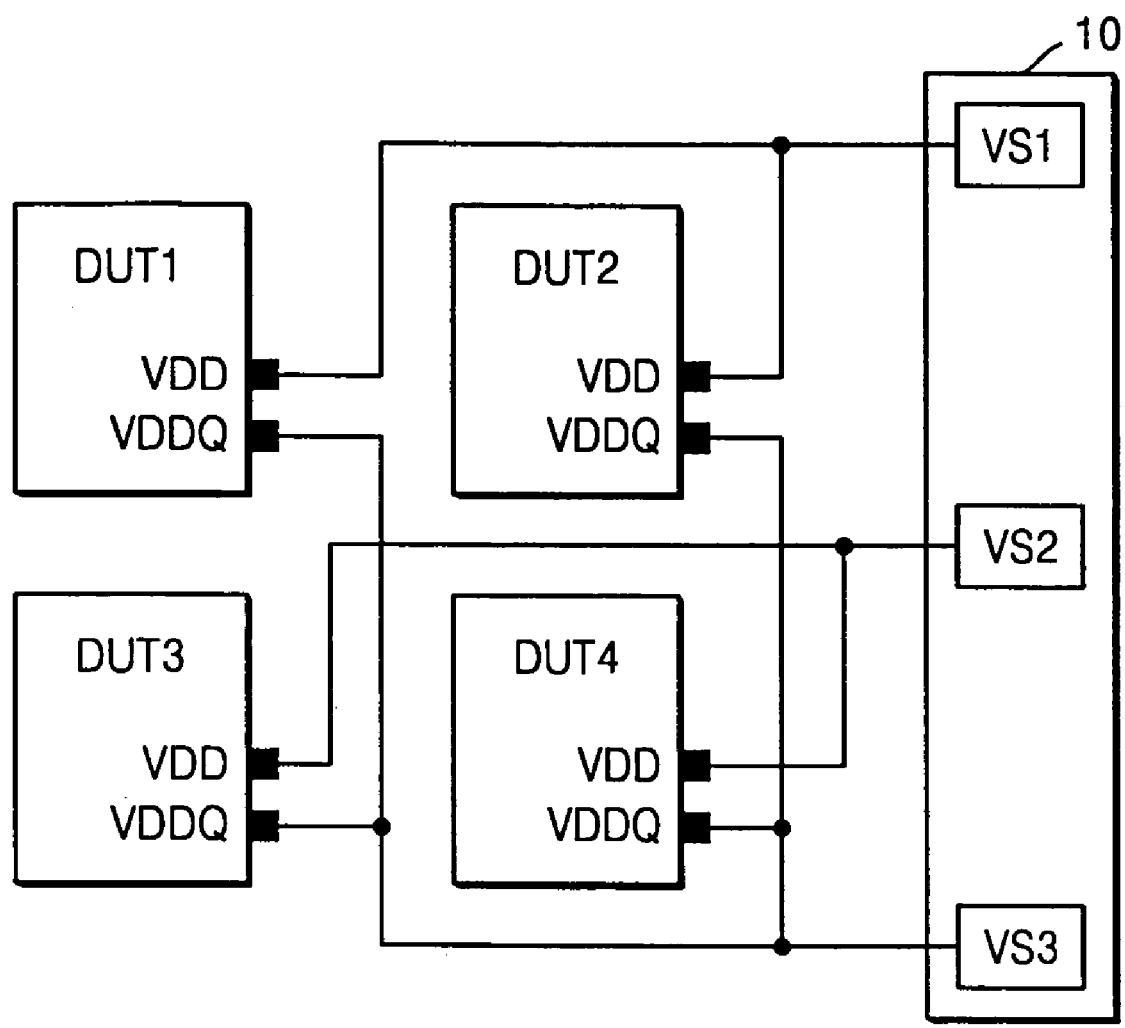
FIG. 1 is a block diagram schematically illustrating a general apparatus that performs a parallel test for a plurality of devices under test (DUTs).

The invention now will be described more fully with reference to the attached drawings, in which exemplary embodiments of the invention are shown. This invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the forms of elements are exaggerated for clarity. To facilitate understanding, identical reference numerals have been used where possible to designate identical elements that are common to the figures.

Figure 2:
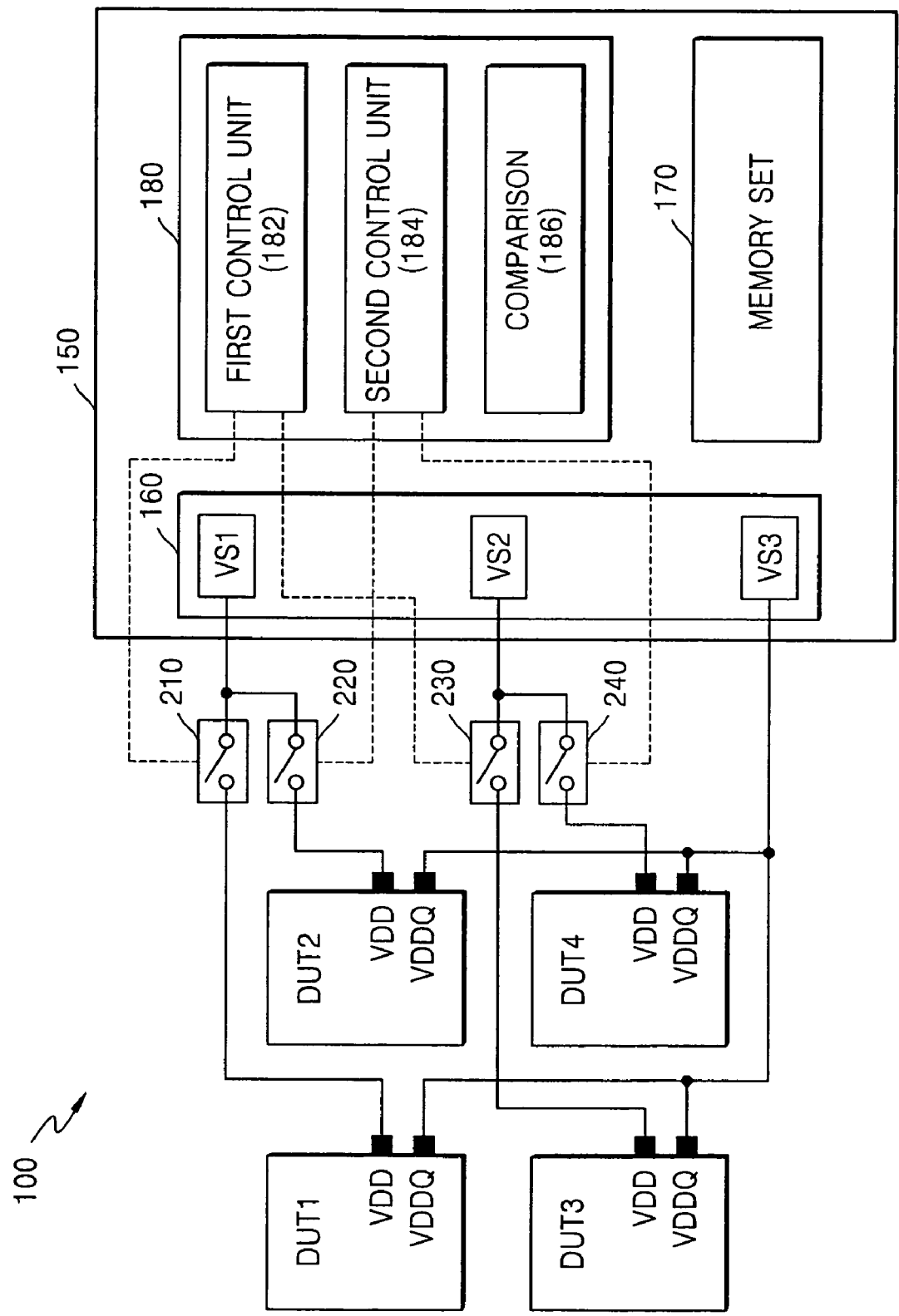
FIG. 2 is a block diagram schematically illustrating a parallel test apparatus according to some embodiments of the invention.

Referring to FIG. 2, a plurality of test devices, for instance, the four devices under test (DUTs), DUT1~DUT4 are connected to a test circuit unit 150. DUT1 through DUT4 each include two power pins VDD and VDDQ may each be an integrated circuit (IC) chip such as a memory device having a memory area.

The test circuit unit 150 is a parallel tester that tests a plurality of DUTs at the same time and may include a power supply 160, a memory set 170, and a controller 180. The power supply 160 provides a test current to each DUT and may be formed of a first through a third power source VS1, VS2, and VS3.

The memory set 170 is a store unit in which data is stored when the DUT works properly.

The controller 180 may be formed of a first and second control unit 182 and 184, and a compare unit 186 for comparing the data stored in the memory set 170 to the data in DUT1 through DUT4.

The VDDs of DUT1 and DUT2 are commonly connected to the first power source VS1, the VDDs of DUT3 and DUT4 are commonly connected to the second power source VS2, and the VDDQs of DUT1 through the DUT4 are commonly connected to the third power source VS3. Accordingly, the three power sources VS1, VS2, and VS3 provide a voltage and a current to the eight power pins. Thus, DUT1 through DUT4 are connected in parallel to the test circuit unit 150.

In addition, a first switching device 210 is connected between the VDD of DUT1 and the first power source VS1 and a second switching device 220 is connected between the VDD of DUT2 and the first power source VS1. Furthermore, a third switching device 230 is connected between the VDD of DUT3 and the second power source VS2 and a fourth switching device 240 is connected between the VDD of DUT4 and the second power source VS2.

The switching devices 210, 220, 230, and 240 may be relays. The first and third switching device 210 and 230 are selectively turned on/off by the first control unit 182 of the controller 180, and the second and fourth switching device 220 and 240 are selectively turned on/off by the second control unit 184 of the controller 180. Moreover, these switching devices 210, 220, 230, and 240 may be designed to be turned on when a high signal is applied from the control unit 182 and 184 of the controller 180 and to be turned off when a low signal is applied from the control unit 182 and 184 of the controller 180.

Figure 3:
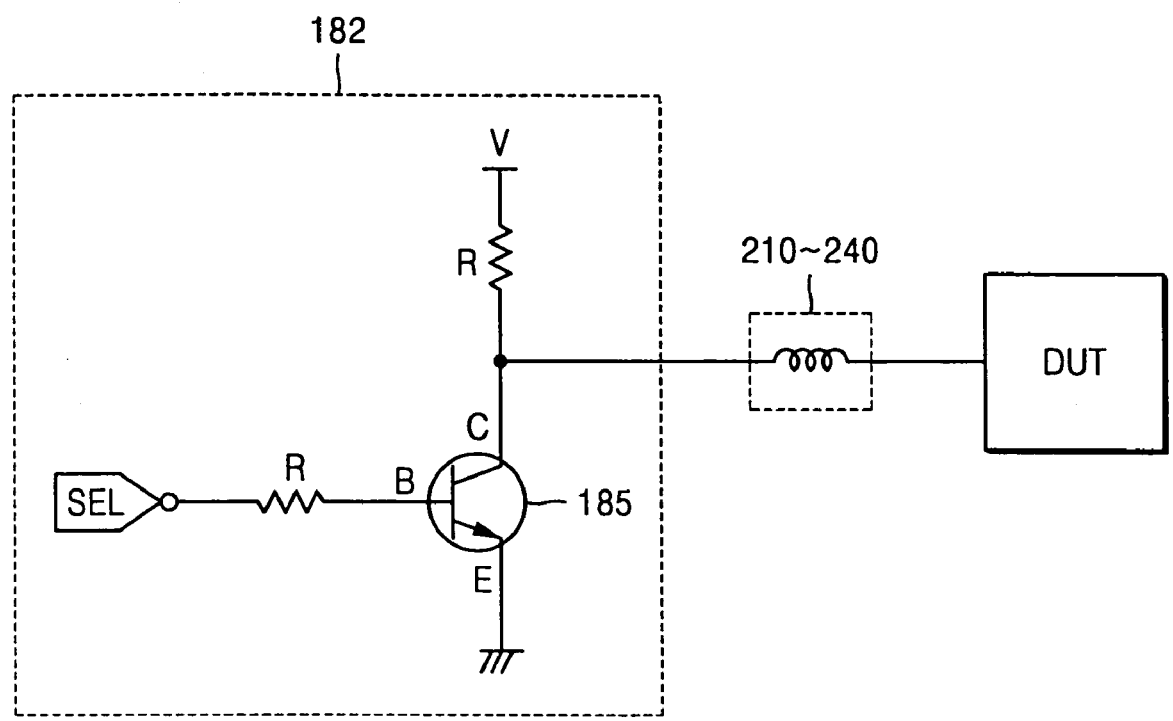
FIG. 3 is a circuit diagram illustrating an example control unit for the parallel test apparatus of FIG. 2.

For example, the first control unit 182, the first switching device 210, and the DUT1 may be formed as shown in FIG. 3. As illustrated in FIG. 3, the first control unit 182 is comprised of a bipolar transistor 185. A selective signal SEL is input in a base B of the bipolar transistor 185 and a drive voltage V, for instance 5V, is applied in a collector C, and an emitter E is grounded. The base B and collector C are connected to a voltage drop resistance R, respectively. The first switching device 210, or the relay and the DUT1 are connected to the collector C, i.e., an output of the bipolar transistor 185.

The first control unit and relay having the above structure is designed to transmit the current of the first power source VS1 to the DUT1 through a process that when a high voltage, for instance, 5V, is applied as the selective signal SEL, the voltage between the collector and emitter VCE becomes, for instance, 0.2V, and the switching device (or the relay) is turned on. Thus, the first control unit and relay are designed to transmit the current of the first power supply VS1 to the DUT1.

In the meantime, if a low voltage, for example, 0V, is applied as the selective signal SEL, the collector-emitter voltage VCE becomes, for example 5V, and thus the first control unit and the relay are designed not to transmit the current of the first power supply VS1 to the DUT1.

Figure 4:
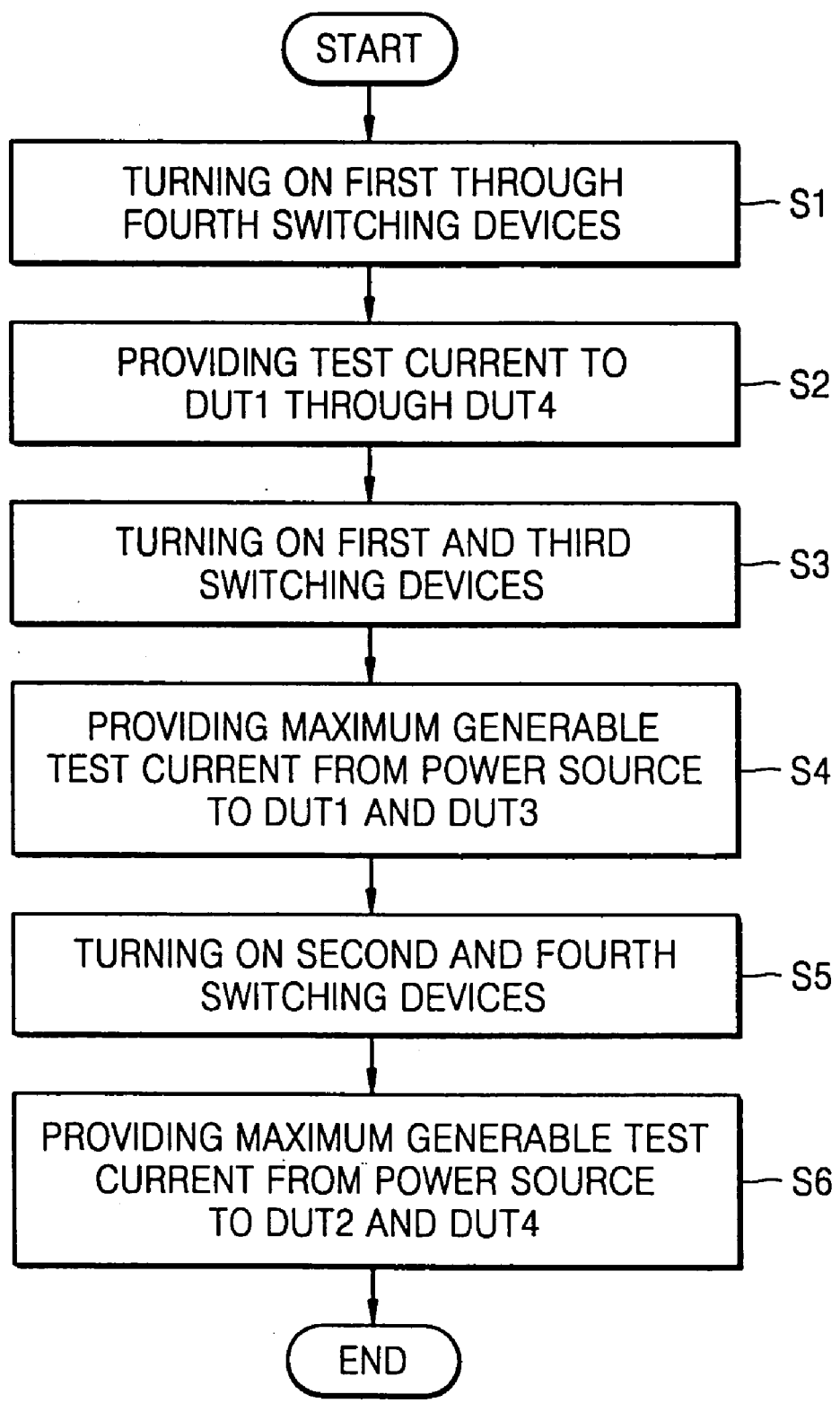
FIG. 4 is a flow chart illustrating an operating method of a parallel test apparatus according to some embodiments of the invention.

A method of operating the parallel test apparatus having the above structure according to some embodiments of the invention will be explained below with respect to FIG. 4.

First, if a high signal is applied as the selective signal SEL of the first and second control unit 182 and 184 of the controller 180, the first through fourth switching devices 210, 220, 230, and 240 are all turned on (process S1) and the test current are provided to each test device from DUT1 through DUT4 (process S2). The current generated from the first power source VS1 is distributed to the VDDs of DUT1 and DUT2 and the current generated from the second power source VS2 is divided to the VDDs of DUT3 and DUT4, respectively. In addition, the current generated from the third power source VS3 is allocated to the VDDQs of DUT1 through DUT4. That is, if the first through the fourth switching devices 210, 220, 230, and 240 are all turned on, half of the current that can be generated from the first and second power source VS1 and VS2 is provided, respectively. For instance, if a maximum 800 mA current can be generated from the first and second power supplies VS1 and VS2, 400 mA current is provided to the VDDs of DUT1 through DUT4 when the first and fourth switching devices 210, 220, 230, and 240 are turned on.

Furthermore, if the high signal as the selective signal SEL of the first control unit 182 is applied and a low signal as the selective signal SEL of the second control unit 184 is applied, the first and the third switching device 210 and 230 are turned on (process S3) and the second and the fourth switching device 220 and 240 are turned off. Then, one DUT is only connected to one power supply, and thus the maximum test current that can be generated from the first and second power source VS1 and VS2 is applied to DUT1 and DUT3 connected to the first and third switching device 210 and 230 (process S4). That is, if the maximum generable current from the first and second power sources VS1 and VS2 is 800 mA, an 800 mA current is provided to the VDDs of DUT1 and DUT3, respectively. By this process, components that require the high current during test can easily be detected.

Moreover, if the high signal as the selective signal SEL is applied to the second control unit 184 and the low signal as the selective signal SEL is applied to the first control unit 182, the second and fourth switching device 220 and 240 are turned on (process S5) and the first and third switching devices 210 and 230 are turned off. Accordingly, the maximum generable test current from the first and second power sources VS1 and VS2 is applied to DUT2 and DUT4 connected to the second and fourth switching devices 220 and 240 (process S6). That is, if the maximum generable current from the first and second power sources VS1 and VS2 is 800 mA, an 800 mA current is provided to the VDDs of DUT2 and DUT4, respectively. In this process, the first and second control units 182 and 184 control two relays that are connected to mutually different power supply, and thus a test time can be reduced.

The invention is not limited to the embodiments described above. Although the embodiments described above have four DUTs and three power sources, the number of DUTs and power sources can be different, but the test result will be the same. What follows are exemplary, non-limiting descriptions of embodiments of the invention.

According to some embodiments of the invention, there is provided a parallel test apparatus to test the four devices under test (DUTs) from DUT1 to DUT4 each including first and second power pins, a parallel test apparatus to test the four devices under test (DUTs) from DUT1 to DUT4 respectively including first and second power pins, the apparatus including a first power source commonly connected to the first pins of DUT1 and DUT2 and providing a test current to the first pins, a second power source commonly connected to the first pins of the DUT3 and DUT4 and providing the test current to the first pins, a third power source commonly connected to the second pins of DUT1 through DUT4 and providing the test current to the second pins, switching devices selectively providing a test signal to one DUT connected to one of the power sources, and a control unit controlling an operation of the switching devices.

The switching devices include a first switching device installed between the first pin of DUT1 and the first power source, a second switching device installed between the first pin of DUT2 and the first power source, a third switching device installed between the first pin of DUT3 and the second power source, and a fourth switching device installed between the first pin of DUT4 and the second power source. The first through the fourth switching devices may be relays.

The control unit includes a first control unit operating the first and third switching device and a second control unit operating the second and fourth switching device.

According to other embodiments of the invention, there is provided a method of operating a parallel test apparatus having four devices under test (DUTs) including first and second power pins that are respectively connected to first and third power sources in a parallel manner, switching devices installed between the first pin of DUTs and the power sources, and first and second control units that control the switching devices, the method including providing a test current respectively distributed to the power pins of DUT1 through DUT4 by turning on all of the first through fourth switching devices, providing a maximum generable test current from the respective power sources to the first pins of DUT1 and DUT3 by turning on the first and third switching devices, and providing the maximum generable test current from the respective power sources to the second pins of DUT2 and DUT4 by turning on the second and fourth switching devices.

As described above, a plurality of DUTs are connected to the power supply (or power source) in the test circuit unit in a parallel manner and the switching devices, for example, the relays, are installed between the respective DUTs and power sources so that the maximum current of the power sources can be provided to all the unit DUTs.

Accordingly, test efficiency and product reliability can be enhanced by selectively providing the maximum generable current from the power sources, when performing the test requiring the high test current.

Furthermore, production cost is lowered by utilizing the existing instrument and supplying the high test current to a plurality of DUTs without an additional instrument.

Also, a test time is shortened since the two relays connected to the different power sources are designed to be simultaneously turned on/off.

While the invention has been particularly shown and described with reference to exemplary embodiments thereof, it will be understood by those of ordinary skill in the art that various changes in form and details may be made therein without departing from the spirit and scope of the invention as defined by the following claims.

We claim:
1. A parallel test apparatus comprising:
a power supply configured to provide a test current to devices under test (DUTs), the DUTs connected to the power supply in a parallel manner, the power supply having power sources;
switching devices, each switching device connected between a corresponding one of the DUTs and one of the power sources, each switching device configured to selectively provide the test current to the corresponding one of the DUTs, wherein at least one switching device is connected to a first one of the power sources and at least one other switching device is connected to a second one of the power sources; and
at least one control unit configured to control the switching devices such that a maximum test current generated by the corresponding one of the power sources is provided to the corresponding one of the DUTs,
wherein the test current is provided only to one DUT out of the plurality of DUTs connected in a parallel manner according to the operation of the switching device, and
wherein the at least one control unit is configured to control the switching devices such that a maximum test current generated by the corresponding one of the power sources is provided to the corresponding one of the DUTs during a first process, and the maximum test current generated by the corresponding one of the power sources is divided between more than one of the DUTs during a second process.

2. The parallel test apparatus of claim 1, the DUTs comprising:
a first set of DUTs, each DUT in the first set of DUTs configured to be selectively connected to a first one of the power sources by a corresponding switching device at the same time that all of the DUTs in the first set of DUTs are connected to a common one of the power sources; and
a second set of DUTs, the second set of DUTs not including any DUTs from the first set of DUTs, each DUT in the second set of DUTs configured to be selectively connected to a second one of the power sources by a corresponding switching device at the same time that all of the DUTs in the second set of DUTs are connected to the common one of the power sources.

3. The parallel test apparatus of claim 1, each of the DUTs comprising a first and a second power pin, the corresponding switching device connected between the first power pin and the one of the power sources.

4. The parallel test apparatus of claim 1, the switching devices comprising relays.

5. The parallel test apparatus of claim 1, the power supply further comprising:
three power sources configured to supply the test current to four DUTs, the first and the second DUTs connected in parallel between the first and the third power sources, the third and the fourth DUTs connected in parallel between the second and the third power sources.

6. The parallel test apparatus of claim 1, each switching device having only one closed position, the only one closed position structured to provide an electrical path between the corresponding one of the DUTs and the corresponding one of the power sources.

7. A parallel test apparatus comprising:
a first power source configured to be connected to a first pin of a first device under test (DUT) by a first switching device and configured to be connected to a first pin of a second DUT by a second switching device, the first power source configured to provide a test current to the first pins of the first and second DUTs;

a second power source configured to be connected to a first pin of a third DUT by a third switching device and configured to be connected to a first pin of a fourth DUT by a fourth switching device, the second power source configured to provide the test current to the first pins of the third and fourth DUTs;

a third power source commonly connected to a second pin of the first DUT, a second pin of the second DUT, a second pin of the third DUT, and a second pin of the fourth DUT, the third power source configured to provide the test current to the second pins of the first, second, third, and fourth DUTs; and a control unit configured to turn the first, second, third, and fourth switching devices off and on, the switching devices structured to conduct the test current from no more than one of the first and second power sources to one of the first, second, third, and fourth DUTs;

wherein the control unit is configured to turn the first, second, third, and fourth switching devices off and on such that current from one of the first and second power sources is divided between more than two of the DUTs during a first process and current from one of the first and second power sources is only connected to one of the DUTs during a second process.

8. The apparatus of claim 7, wherein the control unit comprises:

a first control unit configured to control the first and the third switching devices; and a second control unit configured to control the second and the fourth switching-devices.

9. The apparatus of claim 8, wherein the first and second control units are configured to operate simultaneously or selectively.

10. The apparatus of claim 7, wherein the first, second, third and fourth switching devices comprise a first relay, a second relay, a third relay, and a fourth relay, respectively.

11. A method of operating a parallel test apparatus configured to test a plurality of devices under test (DUTs), each DUT including a first and a second power pin, the parallel test apparatus having at least three power sources, each DUT connected to two of the at least three power sources in a parallel manner, the parallel test apparatus having a plurality of switching devices, each switching device installed between the first power pin of one of the plurality of DUTs and no more than one of the at least three power sources, the parallel test apparatus also having a first and a second control unit to control the plurality of switching devices, the method comprising:

for each group of DUTs that is connected in parallel between one of the at least three power sources and a second one of the at least three power sources, distributing a test current from the one of the at least three power sources to the first power pins of more than one of the group of DUTs by closing more than one of the corresponding switching devices during a first process, and providing a maximum generable test current from the one of the at least three power sources to the first power pin of a selected DUT by closing the corresponding switching device during a second process.

12. The method of claim 11, further comprising:

for each group of DUTs that is connected in parallel between one of the at least three power sources and a second one of the at least three power sources, providing a maximum generable test current from the one of the at least three power sources to the first power pin of another selected DUT by closing the corresponding switching device.

13. The method of claim 12, the plurality of DUTs comprising four DUTs, two of the four DUTs connected in parallel between a first power source and a second power source, the remaining DUTs connected in parallel between a third power source and the second power source.

14. A parallel test apparatus comprising:

a power supply configured to provide a test current to devices under test (DUTs), the DUTs connected to the power supply in a parallel manner, the power supply having at least three power sources;

switching devices, each switching device configured to provide a conductive path for the test current between a corresponding one of the DUTs and one of the at least three power sources; and at least one control unit configured to control the switching devices such that the test current is provided to only one of the DUTs;

wherein the at least one control unit is configured to control the switching devices such that the test current is provided to only one of the DUTs during a first process and is distributed to more than one of the DUTs during a second process.

15. The apparatus of claim 14, wherein all the DUTs are commonly connected to a first one of the at least three power sources, wherein the DUTs are grouped into at least two mutually exclusive sets, and wherein each switching device is configured to provide the conductive path between the corresponding one of the DUTs and no more than one of the at least three power sources.

16. The apparatus of claim 15, wherein the at least one control unit is structured to control a first one of the switching devices, the first one of the switching devices connected to a DUT that belongs to a first one of the at least two mutually exclusive sets, and wherein the at least one control unit is structured to control a second one of the switching devices, the second one of the switching devices connected to a DUT that belongs to a second one of the at least two mutually exclusive sets.

17. The apparatus of claim 16, wherein the DUTs belonging to the first one of the at least two mutually exclusive sets are characterized in that, in addition to the common connection to the first one of the at least three power sources, they may only be connected to a second one of the at least three power sources via a corresponding switching device, and wherein the DUTs belonging to the second one of the at least two mutually exclusive sets are characterized in that, in addition to the common connection to the first one of the at least three power sources, they may only be connection to a third one of the at least three power sources via a corresponding switching device.

18. The apparatus of claim 14, each of the DUTs comprising a first and a second power pin, the corresponding switching device connected between the first power pin and the one of the power sources.

19. The apparatus of claim 14, the switching devices comprising relays.

20. The apparatus of claim 14, the power supply further comprising three power sources configured to supply the test current to four DUTs, the first and the second DUTs connected in parallel between the first and the third power sources, the third and the fourth DUTs connected in parallel between the second and the third power sources.

* * * * *

UNITED STATES PATENT AND TRADEMARK OFFICE
CERTIFICATE OF CORRECTION

PATENT NO. : 7,227,351 B2  
APPLICATION NO. : 10/856461  
DATED : June 5, 2007  
INVENTOR(S) : Woo-Il Kim et al.

Page 1 of 1

It is certified that error appears in the above-identified patent and that said Letters Patent is hereby corrected as shown below:

Column 4, line 16, the words "(process SI)" should read -- (process S1) --.

Signed and Sealed this

Second Day of September, 2008

JON W. DUDAS  
*Director of the United States Patent and Trademark Office*